United States Patent [19]

Varadarajan

[11] Patent Number: 4,539,493
[45] Date of Patent: Sep. 3, 1985

[54] DYNAMIC ECL CIRCUIT ADAPTED TO DRIVE LOADS HAVING SIGNIFICANT CAPACITANCE

[75] Inventor: Hemmige D. Varadarajan, Sunnyvale, Calif.

[73] Assignee: Advanced Micro Devices, Inc., Sunnyvale, Calif.

[21] Appl. No.: 550,528

[22] Filed: Nov. 9, 1983

[51] Int. Cl.³ ............... H03K 19/013; H03K 19/086
[52] U.S. Cl. .................................. 307/455; 307/280; 307/254; 307/299 A; 307/300
[58] Field of Search ........... 307/455, 467, 280, 299 A, 307/300, 268, 270, 254

[56] References Cited

U.S. PATENT DOCUMENTS

| | | | |
|---|---|---|---|
| 3,549,899 | 12/1970 | Beelitz | 307/455 |
| 3,909,637 | 9/1975 | Dorler | 307/455 X |
| 3,978,347 | 8/1976 | Hollstein et al. | 307/455 |
| 4,092,551 | 5/1978 | Howard et al. | 307/300 X |
| 4,276,485 | 6/1981 | Rydval | 307/455 X |
| 4,289,978 | 9/1981 | Konian et al. | 307/455 X |
| 4,347,446 | 8/1982 | Price | 307/455 X |
| 4,409,498 | 10/1983 | Dorler et al. | 307/455 X |
| 4,449,063 | 5/1984 | Ohmichi et al. | 307/280 X |

OTHER PUBLICATIONS

Cases et al., "Emitter-Coupled Logic Totem-Pole Driver with Multiple Wired Logic Function Capability", *IBM TDB*, vol. 20, No. 9, pp. 3471–3472; 2/19/1978.
Chang et al., "Complementary Driver for Emitter-Coupled-Logic Gates"; IBM TDB, vol. 19, No. 12, pp. 4614–4615; 5/1977.
Garrett, "III-ECL and MOS Devices"; *Digital Logic Gates* (McGraw-Hill 1978); pp. 31–38.
Seelbach, *Integrated Circuits Applications Handbook;* Chapter 3, pp. 57–94, "Emitter Coupled Logic"; (Wiley 1983).

*Primary Examiner*—Larry N. Anagnos
*Attorney, Agent, or Firm*—Patrick T. King; Warren M. Becker; J. Vincent Tortolano

[57] ABSTRACT

A dynamic ECL circuit is provided which drives loads having significant capacitance. The dynamic ECL circuit may utilize single level or multiple level logic and may be configured, for example, as an OR/NOR gate. A capacitor is placed between the base of a current source transistor and a circuit point having a logic level complementary to the output connected to the current source. As logic transitions occur within the circuit and are presented on the output, a transient current will be experienced through the capacitor due to the shift in the complementary level thereby momentarily altering the voltage on the base of the current source transistor. The dynamic alteration of base voltage produces a momentary change in the current through the current source transistor which serves to both speed up the high-to-low transition time and the low-to-high transition time on the output line.

20 Claims, 11 Drawing Figures

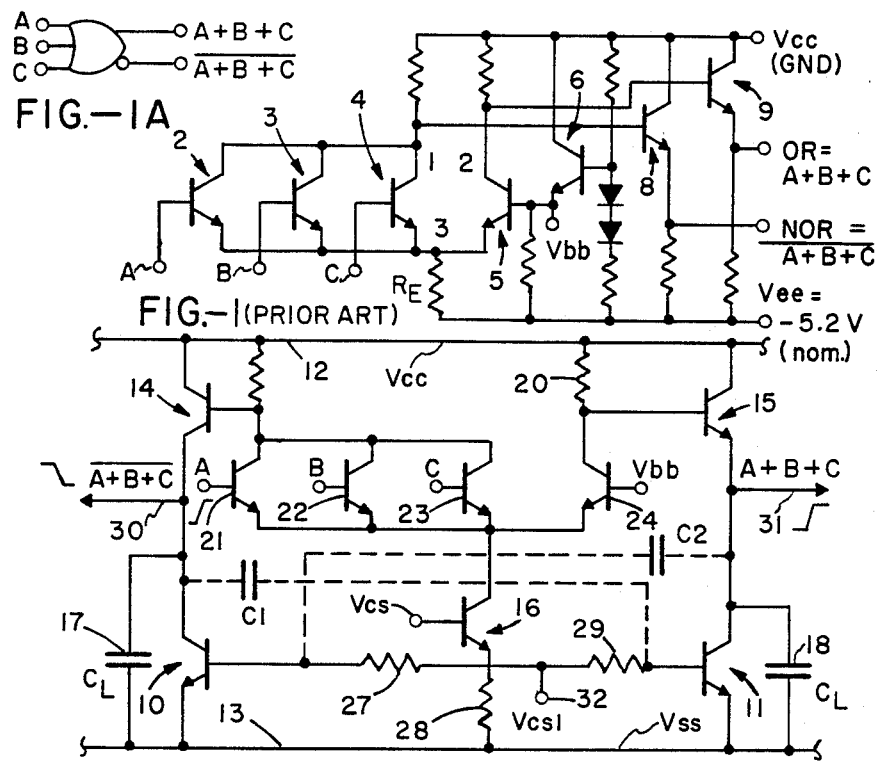
FIG.—1A
FIG.—1 (PRIOR ART)
FIG.—2
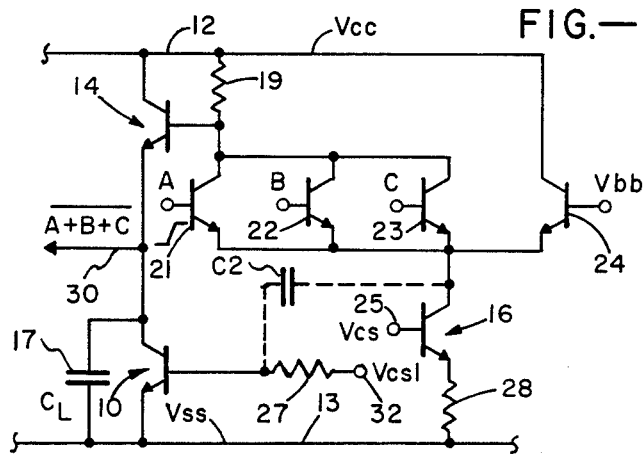
FIG.—3

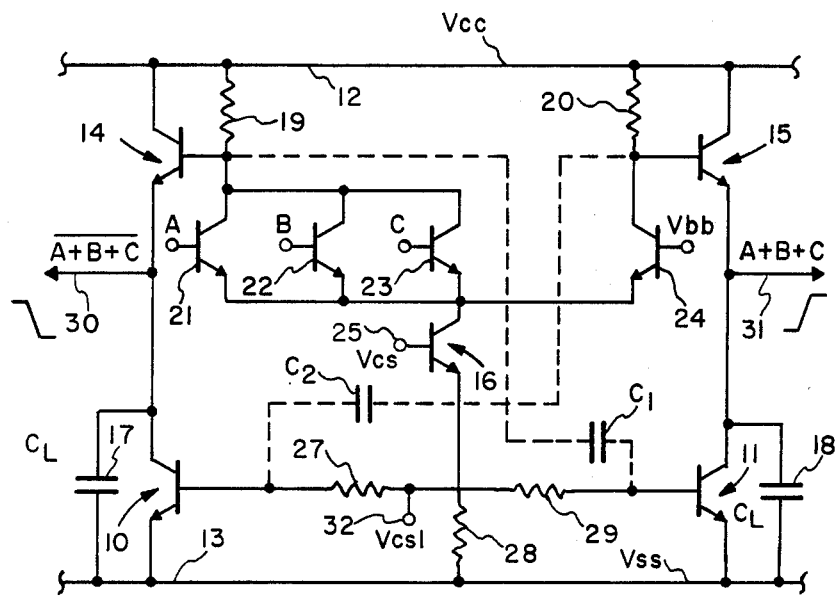
FIG.—4
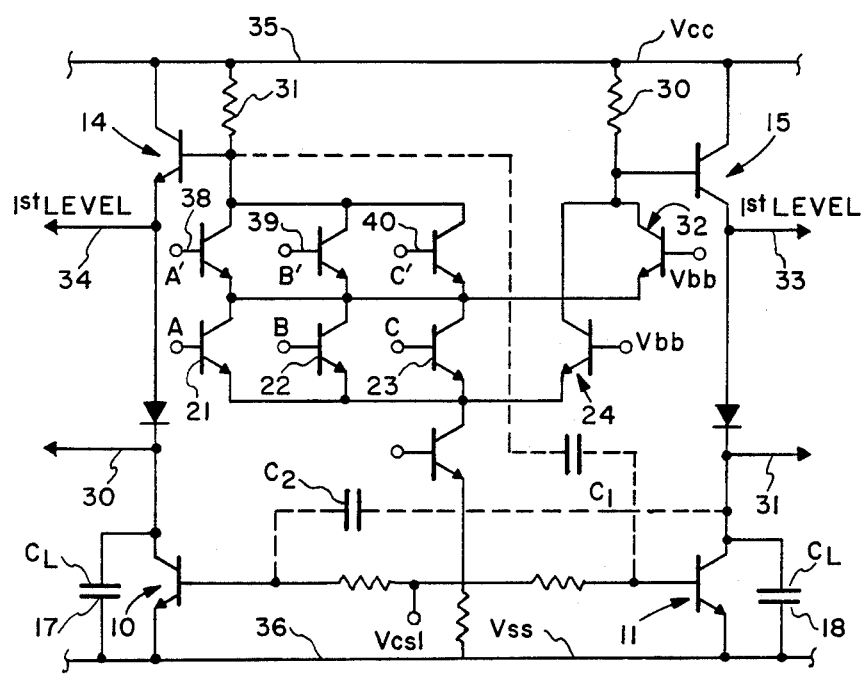
FIG.—5

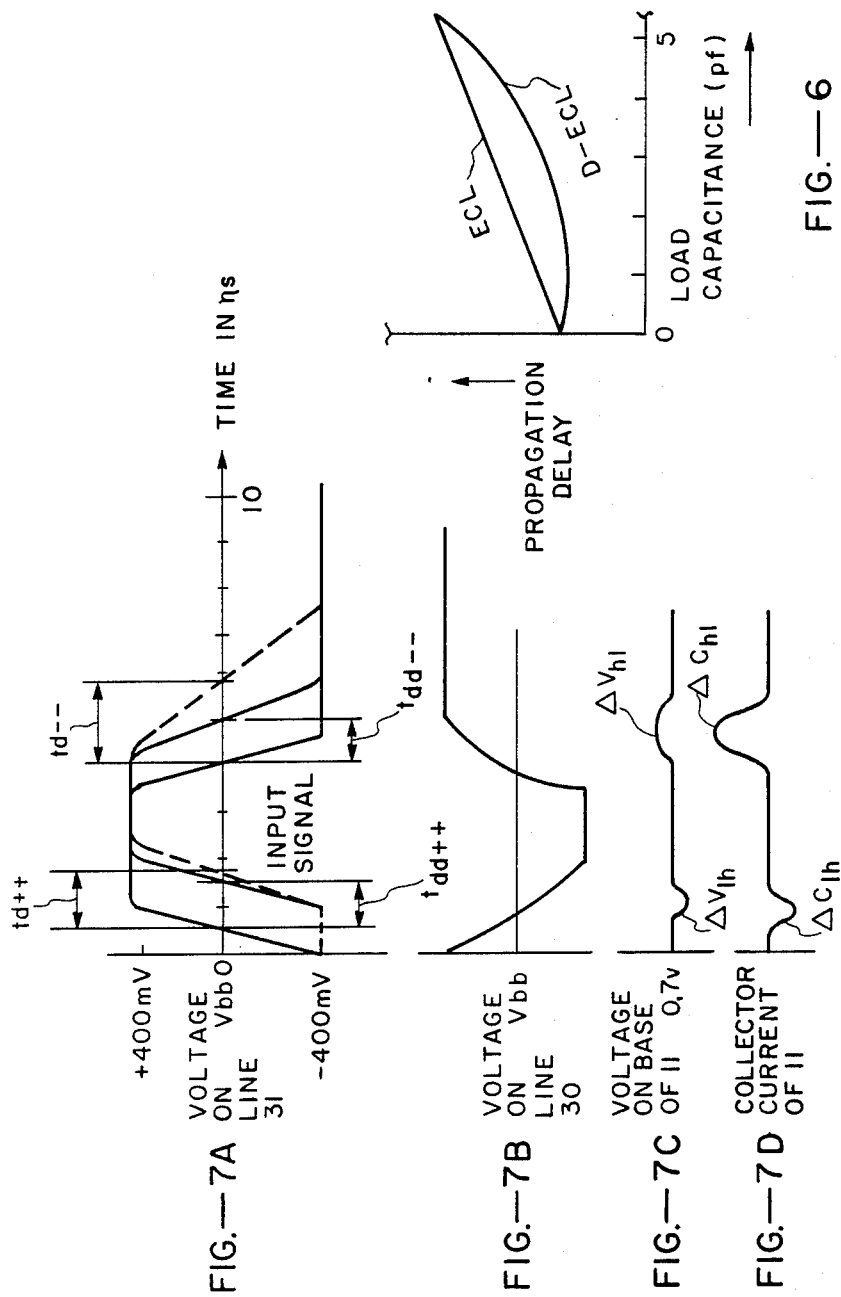

DYNAMIC ECL CIRCUIT ADAPTED TO DRIVE LOADS HAVING SIGNIFICANT CAPACITANCE

BACKGROUND OF THE INVENTION

1. Field of the Invention

This invention relates to a high speed ECL gate circuit and, more particularly, relates to a dynamic ECL gate circuit for driving line loads having significant capacitance.

2. Discussion of Background and Prior Art

A form of current steering logic, known as emitter-coupled logic (ECL) is widely utilized. ECL results in high performance products and has the shortest propagation delay of any logic form. With ECL logic, superior comparator functions and high-speed analog-to-digital conversion may be accomplished. ECL logic is utilized in such diverse applications as instrumentation, computers, phased-array radar, telecommunication systems, and a host of modern electronics applications where high performance is required or desired.

Basic circuit design and processing for ECL is well known. See, e.g., *Integrated Circuits: Design Principles and Fabrication*, R. N. Warner, Jr., ed. McGraw-Hill (1965), Sec. 5–10, pp. 156–159. The most common ECL design is a multiple input OR/NOR gate. Such a gate is a versatile logic building block since it has complementary outputs. However, even though such ECL gates have an inherently low gate propagation delay, they have relatively slow rise and fall times. In addition, the gate propagation delay will be impacted with heavy capacitive loading; as shown in FIG. 6, for conventional ECL, as the load capacitance of the output lines increases, the propagation delay time increases linearly. While ECL circuitry has been shrunk and dense ECL-based logic arrays are self-contained on chip, the advent of very large scale integration (VLSI) has resulted in ECL circuitry in which the cumulative length of metal lines is large, on the order of 7 mm or more for a statistically significant number of devices. This results in capacitive loading of up to 1–10 pF, which is significant for individual ECL gates. See, e.g., A. H. Dansky, "Halving Load Resistances Shortens Long Path Delays", *Electronics*, Oct. 9, 1980, p. 146. This problem pertains also to ECL gate designs since they are based on the same circuit principles. See W. C. Seelbach, "Emitter Coupled Logic", Chp. 3 in *Integrated Circuits Applications Handbook* (Wiley 1983). As a consequence, the inherent speed advantage of ECL, which usually produces industry standard high performance products, disappears with significant capacitive loading.

One attempt to overcome the capacitive loading problem for ECL gates has been to utilize active pull-down transistors which bring down the line voltage at appropriate times in the logic cycle. This approach requires the generation of a separate pulldown reference voltage and does not produce energy efficient operation. See J. E. Price, "Emitter Coupled Logic Circuit With Active Pull-Down", U.S. Pat. No. 4,347,446. Such push-pull arrangements are difficult to design and require extra power supplies.

Another approach has been to couple the bases of output transistors through a resistor to complementary logic levels to increase high-to-low transition times. See, e.g., A. W. Chang et al, "Complementary Driver for Emitter-Coupled-Logic Gates", *IBM Technical Disclosure Bulletin*, v. 19, May, 1977, p. 4614; and M. Cases et al, "Emitter-Coupled Logic Totem-Pole Driver with Multiple Wired Logic Function Capability", *IBM Technical Disclosure Bulletin*, v. 20, February, 1978, p. 3471. This approach involves a continuous consumption of DC power through the resistors, is energy inefficient and is difficult to design.

It is therefore an object of the present invention to provide an ECL gate circuit which is capable of driving significant capacitive loads.

It is another object of the present invention to provide an ECL gate circuit which utilizes on-chip capacitances to speed up the pull-down of the output transitions.

It is another object of the present invention to utilize a complementary logic level within an ECL gate to speed up transitions by generating a voltage transient of appropriate sign on the base of the current source transistor connected to the logic output.

BRIEF DESCRIPTION OF THE DRAWINGS

For a more complete understanding of the present invention, reference may be had to the accompanying drawings which are incorporated herein by reference and in which:

FIG. 1 is a three-input OR/NOR ECL gate of the prior art;

FIG. 1(a) is the logic diagram for the ECL gate of FIG. 1;

FIG. 2 is a schematic diagram of one embodiment of the ECL gate circuit of the present invention;

FIG. 3 is a schematic diagram of another embodiment of the ECL gate circuit of the present invention;

FIG. 4 is a schematic diagram of yet another embodiment of the ECL gate circuit of the present invention;

FIG. 5 is a schematic diagram of an embodiment of the present invention involving dual level logic;

FIG. 6 is a graph showing the relationship between load capacitance and propagation delay for an ECL gate;

FIG. 7a is a timing diagram of the low-to-high and high-to-low transitions on the OR output line of the embodiment of FIGS. 2 and 4;

FIG. 7b is a timing diagram of the complementary NOR output for the embodiment of FIGS. 2 and 4 shown in registration with the OR output of FIG. 7a;

FIG. 7c is a timing diagram of the voltage on the base of current source transistor 11 shown in registration with the logic level transitions of FIGS. 7a and 7b; and FIG. 7d is a timing diagram of the collector current on current source transistor 11 shown in registration with the logic level transitions of FIGS. 7a and 7b.

SUMMARY OF THE INVENTION

An ECL circuit is provided which is adapted to drive loads having significant capacitance. A single level or multiple level ECL gate such as an OR/NOR gate is provided with ancillary capacitors between the bases of the current source transistors and circuit points within the gate circuit having complementary logic levels. As logic levels shift, the occurrence of a transition in the complementary level will produce a transient current through the ancillary capacitor thereby momentarily altering the voltage on the base of the associated current source transistor. When the logic level on the collector of a current source transistor is experiencing a high-to-low transition the base voltage will be momentarily increased due to this transient thereby increasing the current sunk through the current source transistor and speeding up the high-to-low transition time. Similarly, when the level on the collector of a current source transistor is experiencing a low-to-high transition the base voltage will be momentarily decreased due to this transient thereby decreasing the current through the current source transistor and speeding up the low-to-high transition produced by the associated emitter follower.

DESCRIPTION OF THE PREFERRED EMBODIMENTS

The standard building block for ECL logic circuitry is the OR/NOR circuit shown in FIG. 1. Briefly, an application of a high logic signal to the terminals A, B, or C which are the bases, respectively, of bipolar transistors 2, 3 and 4, will result in a high OR output on the emitter of noninverting output transistor 9 and a low NOR output on the emitter of inverting output transistor 8. The logical operation of the OR/NOR gate circuit is symbolized by the logic diagram shown in FIG. 1a. The operation of this conventional ECL gate is described in detail, for example in L. S. Garrett, "ECL and MOS Devices", in *Digital Logic Gates*, McGraw-Hill, pp. 31–38 (1978). As discussed previously, the inherent high-speed operation of an ECL gate such as that shown in FIG. 1 is degraded when line loading of significant capacitance is experienced. This is shown in the generalized diagram of FIG. 6 in which the linear ECL curve indicates increased propagation delay with line capacitance. The improvement due to the dynamic ECL (D-ECL) gate of the present invention is shown in the D-ECL curve. For exceptionally heavy capacitive line loading degradation still occurs.

In practice, it is the downgoing portion of the cycle which is most severely degraded. This may be understood conceptually by examining the operation of the OR/NOR gate circuit of FIGS. 2 and 4. Transistor 15 is an emitter follower (as is its complementary counterpart transistor 14) that provides current to OR output line 31 to produce a low-to-high transition whenever a high input is provided on terminals A, B or C to transistors 21, 22 or 23. Emitter follower 15 is a low impedance device. Thus, as long as a signal voltage is applied to its base a substantial current supply is available to OR output line 31, i.e. a supply which appears unlimited insofar as the modest capacitance $C_L$ of load capacitor 18 on output line 31 is concerned. This may be seen in the relatively fast low-to-high transition shown in FIG. 7a and the associated normal delay $t_{d++}$. On the other hand, transistor 11 is a current source (as is its complementary counterpart 10) and is current limited. When a high-to-low transition is to occur on OR output line 31 current source 11 must sink the charge $C_L$ on line 31. Though continuous, the current through current source transistor 11 is finite and limited. Without the assistance provided by the present invention or without assistance from some other technique as discussed in the Background of the Invention section, the unloading of line charge through current source transistor 11 will take as long as $t_{d--}$, shown in FIG. 7a.

The dynamic ECL circuit of the present invention utilizes on-chip capacitances to provide a transient boost to the current carrying capabilities of the load current source transistors 10 and 11 in ECL gate circuits. The transient boost is generated by connecting a capacitor between the base of the current source transistor and a point in the circuit which carries a complementary logic level. As shown in FIGS. 7a, 7b, 7c and 7d, when the logic level on OR output line 31 is experiencing a low-to-high transition the complementary logic level on NOR output line 30 is experiencing a downgoing transition. Since the complementary logic level is connected through a capacitor to the base of load current source transistor 11, the voltage on the base of current source transistor 11 will drop momentarily by $V_{lh}$ thereby reducing the current through transistor 11 by $C_{in}$. As a consequence, the low-to-high transition on OR output line 31 is assisted and the transition time reduced to less than $t_{d++}$, e.g., to the time $t_{dd++}$. When the logic level on OR output line 31 is experiencing a high-to-low transition, the complementary logic level on NOR output line 30 is rising. Since the complementary logic level is connected through a capacitor to the base of current source transistor 11, as described in detail subsequently, the voltage on the base of current source transistor 11 will rise momentarily by $V_{hl}$ thereby increasing the current through transistor 11 by $C_{hl}$. As a consequence, the high-to-low transition on OR output line 31 is assisted and the transition time is reduced to significantly less than $t_{d--}$, e.g., to the time $t_{dd--}$. The primary benefit is achieved for the downgoing transition.

The preceding paragraph stresses the dynamic nature of the ECL circuit of the present invention. A change in voltage ($V_{lh}$ for the low-to-high transition associated with the collector of the current source transistor and $V_{hl}$ for the high-to-low transition) occurs on the base of the current source transistor only when the complementary logic level is experiencing a change. This is due to the characteristic of capacitors that a differential voltage is experienced on one side only when the voltage is changing on the other side. Once equilibrium is reached, i.e. once the complementary logic level is reached (whether a high level or a low level) there will be no further contribution to the voltage on the base of the current source transistor until the next shift in the complementary logic level. This dynamic approach is contrasted to the steady state or DC approach discussed in the Background section and disclosed in A. W. Chang et al, "Complementary Driver for Emitter-Coupled-Logic Gates", *IBM Technical Disclosure Bulletin*, v. 19, May 1977, p. 4614 and M. Cases et al "Emitter-Coupled Logic Totem-Pole Driver with Multiple Wired Logic Function Capability", *IBM Technical Disclosure Bulletin*, v. 20, February, 1978, p. 3471. The steady state approach requires a constant current to be drawn through the resistors connected to the bases of the current source transistors. As the complementary logic levels shift, the magnitudes of the current in the resistors varies and thus the effect on the current source transistor varies. But, current is always flowing thereby wasting power and requiring a separate power supply. The effect on the current source transistor can be troublesome if the driving logic, e.g. the input logic on terminals A, B, and C, is applied at irregular intervals so that some periods between logic swings are of relatively long duration. With the dynamic ECL gate of the present invention the dynamic impact on the current source transistor is quantized so that no adverse effect occurs if the driving logic appears irregularly.

One embodiment of the dynamic ECL circuit of the present invention is shown in FIG. 2. It is shown as a conventional OR/NOR ECL gate circuit modified in accordance with the present invention. FIGS. 2–4 share common elements and where common devices and functions are indicated, identical numbers are used. The function of the ECL gate circuit, as described above, is to accept logic level inputs on the base terminals A, B and C of transistors 21, 22 and 23 and to provide a logical OR output on line 31 along with a logical NOR output on line 30. The embodiments of FIGS. 2-4 utilize single level logic, i.e. a single voltage level in the input and output. On the other hand, as described subsequently, multiple level logic is possible and a dual level logic scheme is shown in FIG. 5. In FIG. 2, transistor 11, appropriately called a current source transistor, serves to pull down the OR output line 31, while transistor 15, called an emitter follower, serves to pull up the OR output line 31. Similarly, current source transistor 10 serves to pull down NOR output line 30, while emitter follower 14 serves to pull up NOR output line 31. In this description the terms pullup, rising, upgoing and low-to-high are synonyms and the terms pulldown, downgoing, falling and high-to-low are synonyms.

Due to the length of the output lines 31 and 30 and the electrical properties of the associated topological features in an integrated circuit there is a parasitic capacitive load 18 of capacitance $C_L$ on OR output line 31 and a parasitic capacitive load 17 of capacitance $C_L$ on NOR output line 30. As discussed above, they may be large, on the order of 1–10 pF. The present invention assists in taking charge from these capacitances when the line levels go high-to-low and assists in charging these capacitances when the line levels go low-to-high.

As seen in the timing diagrams of FIGS. 7a and 7b, an OR output logic level is produced on line 31 (even dotted line) and a NOR logic level on line 30 (FIG. 7b) following the impression of a logical input (heavy solid line) on base terminals A, B or C of transistors 21, 22 or 23. The upgoing signal on line 31 and the complementary downgoing signal on line 30 follow the input by a short time delay. In a circuit arranged in accordance with the present invention the OR output logic level is advanced as shown by the light solid line. Rise times in conventional ECL gate circuits are typically on the order of 1-2 ns whereas fall times are typically 2-4 ns. As described previously, these rise and fall times are materially reduced by the use of capacitors between the bases of current output transistors and the complementary logic levels. The rise time is reduced from $t_{d++}$ to $t_{dd++}$ and the fall time is reduced from $t_{d--}$ to $t_{dd--}$.

In the first embodiment of FIG. 2, the capacitor $C_2$ is connected between the base of current source transistor 10 and the OR output line 31. And, the capacitor $C_1$ is connected between the base of current source transistor 11 and the NOR output line 30 to take advantage of the complementary logic level available. Either capacitor may be used alone or the two capacitors may be used together as shown, depending on whether there is a circuit requirement for an improved fall time on either or both the OR output or the NOR output.

The bandgap reference voltage $V_{CS}$ is a stable tracking voltage available on all ECL chips. See A. H. Seidman, Integrated Circuits Applications Handbook, pp. 498-499 (1983). This reference voltage is used for controlling the ECL current through transistor 16. A stable bias voltage $V_{CSL}$ is impressed on terminal 32 to provide the bias levels on the bases of the current source transistors 10 and 11. $V_{CSL}$ is coupled through isolating resistor 29 to the base of current source transistor 11 and is coupled through resistor 27 to the base of current source transistor 10. These resistors have large values on the order of 40k ohms to isolate the base for AC coupling with capacitors $C_1$ and $C_2$. The values of $R_{29} \times C_1$ and $R_{27} \times C_2$ must be large so as to have a high time constant so the charge from the capacitor does not trickle away from the bases of the current source transistors. The generation of the stable bias voltage $V_{CSL}$ is made possible by a bias circuit described in the copending application of H. D. Varadarajan, "Bias Circuit for a Dynamically Switchable Current Source", filed on even date herewith. For the embodiments of FIGS. 2 and 4 there is a connection of $V_{CSL}$ to the bases of both the OR output transistor 11 and the NOR output transistor 10. In the embodiment of FIG. 3 the mode of connection of capacitor $C_2$ is only allowed for a NOR output so that a connection of $V_{CSL}$ is only required through resistor 27 to the base of current source transistor 10.

Another embodiment of the present invention is shown in FIG. 4. Here, the base of current source transistor 10 is connected through capacitor $C_2$ to the base of emitter follower 15 and the base of current source transistor 11 is connected through capacitor $C_1$ to the base of emitter follower 14. The nature of operation of emitter follower 14 will be that it will be conductive when NOR output transistor 10 is conductive. Thus, at such time as there is a high-to-low transition taking place on OR output line 31, there will have been a low-to-high transition taking place on NOR output line 30. Emitter follower 14 will have become conductive to supply current to support the low-to-high transition on NOR output line 30. Thus, the base of emitter follower transistor 14 will go to a high level thereby producing a momentary increase in the voltage on the base of transistor 11, $V_{HL}$, as shown in FIG. 7c. This will pull down the output at line 31 sooner than it would have come down by normal means. The benefit is seen as the difference between $t_{d--}$ and $t_{dd--}$ shown in FIG. 7a. A comparable benefit for similar reasons is obtained on low-to-high transitions for OR output line 31. And comparable benefits are obtained for both downgoing and rising transitions on NOR output line 31.

In the embodiment of FIG. 3, the base of current source transistor 10 is shown as being connected through capacitor $C_2$ to the collector of current source transistor 16 and to the common emitters of transistors 21, 22 and 23. This connection is possible since when a high-to-low transition is to take place on NOR output line 30, there will be current flowing through at least one of the transistors 21, 22 and 23 and thence through transistor 16 to low voltage level $V_{SS}$ so that the collector of transistor 16 is rising while NOR output line 30 is falling; hence the collector of transistor 16 serves as a complementary logic level.

The capacitors $C_1$ and $C_2$ shown in FIGS. 2-5 are of small value on the order of 0.05-0.1 pf. They are obtained, for example, by integrating extra bases to the load current source transistor collectors, i.e. to the collector of current source transistor 10 or to the collector of current source transistor 11, shown in FIG. 2, or to the collector of input current source transistor 16, shown in FIG. 3. Such capacitors would be parasitic capacitors. These small capacitances can also be obtained by integrating extra emitters onto current source transistors 10 and 11 and connecting these emitters to the complementary circuit points, i.e. to the collector of current source transistor 10, to the collector of current source transistor 11, etc.

Multiple level logic is now common for ECL gate circuits. The dynamic ECL gate circuit approach of the present invention is applicable to such schemes since they all contain complementary logic levels and have current source transistors which are current limited. By dynamic charge pumping means using a capacitor, as described above, a transient increase or decrease in the current through a given current source transistor is obtained to speed up the transition times on the output line associated with the transistor. As shown in FIG. 5 in a dual level logic scheme there will be two voltage levels or more precisely voltage ranges on OR output line 31 which will signify two discrete logic states. The first level will be uniquely accessible only on line 33; the second will be accessible on line 31. Similarly, there will be two voltage ranges on NOR output line 30 which will signify different logic states with the first logic level only being accessible on line 34; the second will be accessible on line 30. In order to provide inputs for the two logic levels, additional input transistors 38, 39 and 40 are provided so that additional logic inputs A', B' and C' may be provided. An additional reference voltage $V_{BB}'$ is provided on the base of transistor 32 which has a common emitter coupling with the additional input transistors 38, 39 and 40. Transistor 32 provides a base drive for emitter follower 15 in accordance with the sense of the second logic levels. In the context of the dual level logic of FIG. 5, the method and apparatus of the present invention functions as described with respect to single level logic. Thus, capacitor $C_1$ may be connected between the base of current source transistor 11 and the base of emitter follower 14. When the complementary logic swing is occurring on the base of emitter follower 14 a transient change in the voltage on the base of current source transistor will occur. Similarly, capacitor $C_2$ may be connected between the base of current source transistor 10 and the collector of current source transistor 11. As with the above discussion for single level logic, what is required is that the base of one of the output transistors be tied through a capacitor to the complementary logic levels within the circuit to generate a transient change in the voltage on the base of the current source transistor to thereby assist the emitter follower coupled thereto to charge the capacitor $C_L$ and to assist the current source transistor to discharge the capacitor $C_L$ to speed up the logic transitions.

The foregoing description of a preferred embodiment of the invention has been presented for purposes of illustration and description. It is not intended to be exhaustive or to limit the invention to the precise form disclosed, and many modifications and variations are possible so long as the base of a current source transistor is connected through a capacitor to a circuit point having a complementary logic level. The embodiments were chosen and described in order to best explain the principles of the invention and its practical application to thereby enable others skilled in the art to best utilize the invention in yet additional embodiments and with various modifications as are suited to the particular use contemplated. It is intended that the scope of the invention be defined by the claims appended hereto.

What is claimed is:

1. In an ECL OR/NOR gate circuit having multiple input transistors, a reference voltage transistor, complementary output lines having inverting and non-inverting characteristics, emitter followers for pulling up the output lines and current source transistors for pulling down the output lines, the improvement comprising:
   a capacitor connected between the base of at least one of said current source transistors and a circuit point having a logic level which is complementary to the logic level of said output line pulled down by said current source transistor for providing a transient increase of potential on said base of said current source transistor when said circuit point goes from a low to a high logic level.

2. An improved ECL OR/NOR gate circuit in accordance with claim 1 wherein said capacitor comprises a parasitic capacitor.

3. An improved ECL OR/NOR gate circuit in accordance with claim 2 wherein said base of said at least one of said current source transistors is fabricated in close physical proximity to said circuit point having a complementary logic level to thereby produce said parasitic capacitor.

4. An improved ECL gate circuit in accordance with claim 1 wherein said capacitor comprises an extra emitter of said current source transistor, said extra emitter being connected with said circuit point having a complementary logic level.

5. An ECL gate circuit for driving load lines having significant capacitance, comprising:
   at least two input transistors having their collectors connected through a resistor to a supply voltage $V_{CC}$ and having their emitters connected together, the logical inputs to said ECL gate being supplied to the bases of said input transistors;
   a reference transistor having the reference voltage $V_{BB}$ impressed on its base, the emitter of said reference transistor being connected to said emitters of said at least two input transistors, the collector of said reference transistor being connected through a resistor to said supply voltage $V_{CC}$;
   a current source transistor for pulling down the logic level of an output line, the collector of said current source transistor being connected to said output line, and the emitter of said current source transistor being connected to a ground line;
   an emitter follower for pulling up the logic level of said output line, the collector of said emitter follower being connected to the supply voltage $V_{CC}$, the emitter being connected to said output line, and the base being connected to said collector of said reference transistor;
   a main current source transistor having its collector connected to said common emitter connection of said at least two input transistors and having its emitter connected to a low level potential through a resistor, the base of said main current transistor being connected to a reference voltage; and
   a capacitor connected between the base of said current source transistor and a complementary circuit point having a logic level complementary to the level on said output line of said current source transistor whereby a transient voltage is impressed upon said base of said current source transistor during logic level transitions on said output line to speed up said transitions.

6. An ECL gate circuit in accordance with claim 5, in combination with bias circuit means for biasing said base of said current source transistor.

7. An ECL gate circuit in accordance with claim 6 in combination with an isolation resistor connected between said bias circuit means and said base of said current source transistor to isolate said transient voltage on said base.

8. An ECL gate circuit in accordance with claim 7 in combination with a second current source transistor having its emitter connected to ground, having its collector coupled to a inverting output line and having its base coupled through a second isolating resistor to said bias circuit means and in further combination with a second emitter follower having its collector connected to said supply line $V_{CC}$, having its emitter connected to said inverting output line and having its base connected to said common collector connection of said at least two input transistors whereby said combination constitutes an ECL OR/NOR gate circuit.

9. An ECL OR/NOR gate circuit in accordance with claim 8 in said capacitor is connected between said base of said current source transistor and said collector of said second current source transistor.

10. An ECL OR/NOR gate circuit in accordance with claim 8 further comprising a second capacitor connected between said base of said second current source transistor and said collector of said current source transistor.

11. An ECL OR/NOR gate circuit in accordance with claim 10 wherein said capacitor is connected between said base of said current source transistor and said collector of said second current source transistor.

12. An ECL OR/NOR gate circuit in accordance with claim 10 wherein said capacitors comprise integrated capacitors.

13. An ECL gate circuit in accordance with claim 10 wherein said capacitors comprise emitters added to said current source transistors, said emitters being coupled to the respective circuit points to which said bases of said current source transistors are connected.

14. An ECL OR/NOR gate circuit in accordance with claim 8 wherein said capacitor is connected between sai said current source transistor and said base of said second emitter follower.

15. An ECL OR/NOR gate circuit in accordance with claim 8 further comprising a second capacitor connected between said base of said second current source transistor and said base of said emitter follower.

16. An ECL OR/NOR gate circuit in accordance with claim 15 wherein said capacitor is connected between said base of said current source transistor and said base of said second emitter follower.

17. An ECL OR/NOR gate circuit in accordance with claim 15 wherein said capacitors comprise integrated capacitors.

18. An ECL gate circuit in accordance with claim 15 wherein said capacitors comprises emitters added to said current source transistors, said emitters being coupled to the respective circuit points to which said bases of said current source transistors are connected.

19. An ECL gate circuit in accordance with claim 5 wherein said reference voltage on said base of said main current source transistor is the bandgap reference voltage.

20. An ECL gate circuit in accordance with claim 5 wherein said capacitor is connected between said base of said current source transistor and said collector of said main current source transistor.

* * * * *